United States Patent [19]

Kushi et al.

[11] Patent Number: 5,149,776
[45] Date of Patent: * Sep. 22, 1992

[54] CROSS-LINKING HARDENABLE RESIN COMPOSITION, METAL LAMINATES THEREOF AND METAL SURFACE PROCESSING METHOD THEREWITH

[75] Inventors: Kenji Kushi; Ken-ichi Inukai; Takayuki Iseki; Seiya Koyanagi; Yasuyuki Fujimoto, all of Hiroshima, Japan

[73] Assignee: Mitsubishi Rayon Co., Ltd., Tokyo, Japan

[*] Notice: The portion of the term of this patent subsequent to Jan. 15, 2008 has been disclaimed.

[21] Appl. No.: 614,123

[22] Filed: Nov. 16, 1990

[30] Foreign Application Priority Data

Nov. 17, 1989 [JP] Japan ................... 1-299130

[51] Int. Cl.⁵ .............................................. G03C 1/725
[52] U.S. Cl. .................................... 430/288; 430/281; 430/285; 522/102; 522/109
[58] Field of Search ................. 430/288, 281, 285; 522/102, 109

[56] References Cited

U.S. PATENT DOCUMENTS

| | | | |
|---|---|---|---|
| 4,239,849 | 12/1980 | Lipson et al. | 430/281 |
| 4,245,031 | 1/1981 | Chambers | 430/288 |
| 4,427,760 | 1/1984 | Nagazawa et al. | 430/288 |
| 4,495,271 | 1/1985 | Geissler et al. | 430/277 |
| 4,970,135 | 11/1990 | Kushi et al. | 430/280 |
| 4,985,343 | 1/1991 | Kushi et al. | 430/288 |
| 4,988,605 | 1/1991 | Kuhota et al. | 430/270 |

FOREIGN PATENT DOCUMENTS

| | | |
|---|---|---|
| 382524 | 8/1990 | European Pat. Off. . |
| 63266448 | 11/1988 | Japan . |
| 155550 | 3/1989 | Japan . |
| 155551 | 3/1989 | Japan . |

*Primary Examiner*—Marion E. McCamish
*Assistant Examiner*—Mark A. Chapman
*Attorney, Agent, or Firm*—Oblon, Spivak, McClelland, Maier & Neustadt

[57] ABSTRACT

A photopolymerizing cross-linking hardenable resin composition is disclosed which is comprised of a binder resin, cross-linking monomer and photopolymerization initiator. The composition of each of the above mentioned components is such that dry film resist incorporating the resin composition of the present invention and used in processes for selective etching and plating of printed circuit boards can be developed in weak aqueous alkaline solution after selective exposure to light. In this way, the efficient and economical manufacture of high definition printed circuit boards is made possible. Additionally, dry film resist incorporating the photopolymerizing cross-linking hardenable resin composition of the present invention lends to easy handling and storage characteristics.

8 Claims, No Drawings

CROSS-LINKING HARDENABLE RESIN COMPOSITION, METAL LAMINATES THEREOF AND METAL SURFACE PROCESSING METHOD THEREWITH

BACKGROUND OF THE INVENTION

1. Field of the Invention

The present invention pertains to cross-linking hardenable resin compositions, metal laminates with cross-linking hardenable resin compositions, and methods for processing metal surfaces with such compounds.

2. Background Art

In recent years, so-called dry film resist has come into widespread use as photo-resist employed in the manufacture of printed circuit boards, where dry film resist generally consists of a photopolymerizable resin composition layer sandwiched between a supporting film layer and a protective film layer. Examples of photopolymerizable resin compositions which have been applied to this type of dry film resist include solvent developing resin compositions and alkali developing resin compositions, the former characterized in that portions thereof that have not been exposed to light can be selectively removed by treatment with a suitable chloro-organic solvent, and the latter characterized in that unexposed portions thereof can be selectively removed using an alkaline aqueous solution. Due to environmental considerations as well as increased costs associated with solvent developing dry film resists, alkali developing dry film resists have come to be the most widely employed.

To use alkali developing dry film resist having a supporting film layer and a protective film layer, first of all, while peeling away the protective film layer from the dry film resist, the surface of the photopolymerizable resin composition layer is heat laminated with a copper clad board, after which a photo-mask is placed on a surface of the protective film layer. The above mentioned photo-mask has a cut-out pattern such that portions of the underlying protective film surface which correspond to areas of the photopolymerizable resin composition layer to be removed are covered by the mask, and portions of the protective film surface corresponding to areas of the photopolymerizable resin composition layer not to be removed are left exposed.

The board is then exposed to ultraviolet light or some other form of radiant energy applicable to the type of photopolymerizable resin composition in use, whereupon photopolymerization and therefore hardening occurs at the portions not covered by the photo-mask. The protective layer is then peeled away after which the board is treated with an aqueous solution of sodium carbonate or some other weakly alkaline aqueous solution thereby effecting development, in other words, removal of the photopolymerizable resin composition at portions which were previously covered by the mask and hence not exposed to ultraviolet light. Thus, by the above described process, a resist pattern is selectively formed on the copper clad board.

For circuit boards with copper through-holes, after etching, the hardened resist pattern is stripped away by treatment with a strong alkaline aqueous solution such as aqueous sodium hydroxide solution, whereby the printed circuit board is obtained. For circuit boards with tin-lead plated through-holes, after tin-lead plating, the hardened resist pattern is stripped away by treatment with strong aqueous base, after which the copper is etched with the tin-lead plating acting as resist, whereby the printed circuit board is obtained.

In the above described processing, it is of course necessary that the dry film resist be able to withstand subsequent etching, plating, and other processes during the manufacture of the printed circuit board. Various studied have been carried out concerning ways to improve the ability of dry film resist to withstand such processing.

In the case of photopolymerizable resin compositions employed in alkali developing dry film resist, many of the resist resin components used in these are hard to the point that when heat laminated to the surface of the copper baseplate of the copper clad board, irregularities in the surface of the copper baseplate are not adequately filled in with the resist resin, thus resulting in the formation of crevices between the resist resin and copper baseplate. In such a case, even though the resist resin components themselves have excellent ability to resist the action of various chemicals, during plating, etching, or other chemical processes, the etching or plating solutions, cleaning or degreasing solvents, etc. can enter into these crevices, progressively penetrating along the interface between the resist resin and copper baseplate, following along continuities between crevices formed therebetween, in this way, finally resulting in short circuits or open circuits in the finished circuit board.

For the above reason, attempts have been made to produce more flexible photopolymerizable resin compositions, so that when lamination is carried out, the resist resin adequately conforms to the surface of the copper baseplate, thereby eliminating the formation of crevices and pockets between the resist resin and copper baseplate, as well as the attendant problems. As a result, adequately flexible photopolymerizable resin compositions have been produced, but with these, the problem referred to as cold flow phenomena occurs, that is, the resist resin components end up being too soft, for which reason there is a tendency for the resin to ooze from the ends of rolls of dry film resist formed therefrom.

For reasons described in the preceding paragraphs, with the various types of conventional dry film resist which have been available up to the present time, none of these conventional dry film resists have been able to simultaneously provide optimal laminating properties as well as improved storage properties with absence of cold flow.

SUMMARY OF THE INVENTION

In view of the above described shortcomings of conventional photopolymerizable resin compositions used in the manufacture of dry film resist, it is an object of the present invention to provide an alkaline developing cross-linking resin composition, metal laminates formed therewith, and a manufacturing method for metal composites thereof, where the alkaline developing cross-linking resin composition is polymerizable by exposure to light or other forms of radiant energy, and has improved storage properties such that cold flow does not occur with dry film resist formed therefrom when stored at room temperature, and which demonstrates excellent laminating properties such that at the time of lamination therewith, the resin composition readily conforms with irregularities in the baseplate to which the photopolymerizable resin composition is laminated, and remains tightly adherent to the baseplate following lamination.

As a result of extensive investigation by the present inventors, a cross-linking hardenable resin composition has been developed through use of which, the above described object of the present invention can be readily achieved. Accordingly, in order to realize the stated object of the present invention, a cross-linking hardenable resin composition is provided including a mixture of:

a) 45 to 75 parts by weight of binder resin comprised of thermoplastic resin component A and thermoplastic resin component B, where thermoplastic resin component A and thermoplastic resin component B each have a molecular weight ranging from 75,000 to 200,000, and the ratio by weight of thermoplastic resin component A to thermoplastic resin component B is in the range of 1:9 to 9:1;

b) 25 to 55 parts by weight of cross-linking monomer, where each molecule of cross-linking monomer includes at least 2 carbon-carbon double bonds; and c) 0 to 10 parts by weight of photopolymerization initiator, such that when the amount of each of the above mentioned binder resin, cross-linking monomer and photopolymerization initiator making up the above mentioned mixture is expressed in terms of parts by weight of said mixture, the total thereof equals 100.

Thermoplastic resin component A in the above mentioned binder resin has a glass transition temperature ($T_g$) measured by differential scanning calorimetry (DSC) in the range of 66 to 88° C., and each 100 parts by weight thereof is comprised of:

i) 15 to 35 parts by weight thereof of first polymerizable substance, the first polymerizable substance in turn made up of at least one type of chemical compound consisting of $\alpha$, $\beta$-unsaturated, carboxyl group possessing monomer having 3 to 15 carbon atoms per monomer molecule;

ii) 10 to 55 parts by weight thereof of second polymerizable substance, the second polymerizable substance being at least one type of chemical compound selected from the group of chemical compounds including 1 to 8 carbon atom alkyl group possessing alkyl acrylate compounds, and 2 to 8 carbon atom hydroxyalkyl group possessing hydroxyalkyl acrylate compounds;

iii) 10 to 75 parts by weight thereof of third polymerizable substance, the third polymerizable substance being at least one type of chemical compound selected from the group of chemical compounds including 1 to 8 carbon atom alkyl group possessing alkyl methacrylate compounds, and 2 to 8 carbon atom hydroxyalkyl group possessing hydroxyalkyl methacrylate compounds; and iv) 0 to 45 parts by weight thereof of fourth polymerizable substance, the fourth polymerizable substance being at least one type of chemical compound selected from the group of chemical compounds including styrene compounds and ring substituted styrene compounds, where styrene compounds are those described by general chemical structure diagram I below:

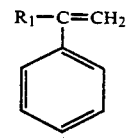

where $R_1$ represents a hydrogen atom, halogen atom, or an alkyl group having 1 to 6 carbon atoms;

Thermoplastic resin component B in the above mentioned binder resin is a co-polymer component with $T_g$ as measured by DSC ranging from 92 to 120° C., and each 100 parts by weight thereof is comprised of:

v) 15 to 35 parts by weight thereof of first polymerizable substance, the first polymerizable substance in turn made up of at least one type of chemical compound consisting of $\alpha$, $\beta$-unsaturated, carboxyl group possessing monomer having 3 to 15 carbon atoms per monomer molecule;

vi) 5 to 30 parts by weight thereof of second polymerizable substance, the second polymerizable substance being at least one type of chemical compound selected from the group of chemical compounds including 1 to 8 carbon atom alkyl group possessing alkyl acrylate compounds, and 2 to 8 carbon atom hydroxyalkyl group possessing hydroxyalkyl acrylate compounds;

vii) 10 to 80 parts by weight thereof of third polymerizable substance, the third polymerizable substance being at least one type of chemical compound selected from the group of chemical compounds including 1 to 8 carbon atom alkyl group possessing alkyl methacrylate compounds, and 2 to 8 carbon atom hydroxyalkyl group possessing hydroxyalkyl methacrylate compounds; and viii) 0 to 45 parts by weight thereof of fourth polymerizable substance, the fourth polymerizable substance being at least one type of chemical compound selected from the group of chemical compounds including styrene compounds and ring substituted styrene compounds, where styrene compounds are those compounds described by general chemical structure diagram II below:

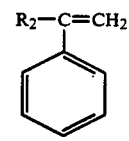

where $R_2$ represents a hydrogen atom, halogen atom, or an alkyl group having 1 to 6 carbon atoms.

Characteristics of the resin composition of the present invention deserving special mention include the fact that when the resin composition is incorporated into dry film resist, no cold flow occurs under storage conditions, even at room temperature. In spite of the fact that cold flow is eliminated, when heat laminated to a baseplate, the resin composition of the present invention adheres tightly thereto, and is sufficiently soft such that the resin composition readily conforms to irregularities in the surface of the baseplate, thereby eliminating crevices and pockets between the resin composition layer and baseplate. By thus eliminating crevices and pockets, penetration of etching fluid, plating fluid, solvents and the like between the resin composition layer and baseplate is eliminated, along with the consequent problems such as short circuits and open circuits in the finished circuit boards. Thus, storage and management of dry film resist employing the resin composition of the present invention is considerably facilitated, and production of defective circuit boards when using such dry film resist is virtually eliminated, thus providing for economical, reliable, high yield production of high quality circuit boards, along with minimized maintenance and manual labor requirements.

Further, using a laminate prepared by heat laminating a sheet of the cross-linking hardenable resin composition described above with a suitable metal baseplate, then selectively exposing the cross-linking hardenable resin composition surface of the laminate thus formed to light, or some other suitable form of radiant energy, it is possible to then selectively remove portions of the cross-linking hardenable resin composition that have not been exposed to light by treating with a weak alkaline aqueous solution. The remaining portions of cross-linking hardenable resin composition not removed by the weak alkaline aqueous solution, and thus still adherent to the metal baseplate, can then be used as a resist pattern whereby selective etching and/or plating of the baseplate can be effected. Thus, the present invention provides a processing means whereby economical, reliable, high yield production of high quality circuit boards is possible as mentioned above, using only a weak alkaline aqueous solution to remove unhardened resist prior to etching or plating. In this way, in addition to the other benefits described above, with the processing method of the present invention, the need for chloro-organic solvents is eliminated, along with the attendant increased costs and hazards to personal and the environment.

DETAILED DESCRIPTION OF THE PREFERRED EMBODIMENTS

In the following section, the cross-linking hardenable resin composition of the present invention will be described in detail.

As described previously in this document, a binder resin is one of the components making up the cross-linking hardenable resin composition of the present invention. This binder resin is itself made up of a mixture of two thermoplastic resin components, namely, thermoplastic resin component A and thermoplastic resin component B.

The above mentioned thermoplastic resin component A is in turn made up of first, second, third and fourth polymerizable substances. The first polymerizable substance comprises at least one type of chemical compound consisting of $\alpha, \beta$-unsaturated, carboxyl group possessing monomer having 3 to 15 carbon atoms per monomer molecule, and preferably 3 to 6 carbon atoms per monomer molecule. Examples of this kind of chemical compound include acrylic acid, methacrylic acid, cinnamic acid, crotonic acid, sorbic acid, itaconic acid, propiolic acid, maleic acid, fumaric acid, as well as monoesters and acid anhydrides of suitable dicarboxylic acids. Among the aforementioned chemical compounds, acrylic acid and methacrylic acid generally provide the best performance. The first polymerizable substance constituted as described above should account for 15 to 35 weight % of the above mentioned thermoplastic resin component A, and preferably 18 to 30 weight thereof. When included in an amount of less than 15 weight % of thermoplastic resin component A, development is not achieved by the alkaline aqueous solution or requires to long a period of time, thus resulting in poor definition of the resist pattern. When the first polymerizable substance is included in an amount of greater than 35 weight % of thermoplastic resin component A, development occurs too rapidly, and the process is thus difficult to control. Additionally, under such circumstances, the ability of the cross-linked hardened portions to withstand the alkaline aqueous solution may be decreased.

The above mentioned second polymerizable substance serving as one of the four components making up thermoplastic resin component A consists of at least one type of chemical compound selected from the group of chemical compounds including 1 to 8 carbon atom alkyl group possessing alkyl acrylate compounds and 2 to 8 carbon atom hydroxyalkyl group possessing hydroxyalkyl acrylate compounds. Examples of chemical compounds which may suitably be incorporated into the second polymerizable substance include methyl acrylate, ethyl acrylate, n-propyl acrylate, isopropyl acrylate, n-butyl acrylate, sec-butyl acrylate, t-butyl acrylate, 2-hydroxy ethyl acrylate, 2-hydroxy propyl acrylate and 2-ethyl hexyl acrylate. Among the aforementioned chemical compounds, methyl acrylate, ethyl acrylate, n-butyl acrylate and 2-ethyl hexyl acrylate generally provide the best performance.

In order to provide optimal flexibility characteristics for the cross-linking hardenable resin composition of the present invention, the second polymerizable substance constituted as described above should account for 10 to 55 weight % of the above mentioned thermoplastic resin component A, and preferably 12 to 45 weight % thereof. When included in an amount of less than 10 weight % of thermoplastic resin component A, dry film resist prepared therefrom is not sufficiently flexible, for which reason sufficient adherence to the metal baseplate and conformation to irregularities in the surface thereof is not obtained. When the second polymerizable substance is included in an amount of greater than 55 weight % of thermoplastic resin component A, dry film resist prepared therefrom ends up being overly soft, for which reason there is a tendency for these resin components to ooze from the ends of rolls of dry film resist incorporating the resin composition, that is, the previously described cold flow phenomena tends to occur.

The above mentioned third polymerizable substance serving as one of the four components making up thermoplastic resin component A becomes incorporated into co-polymers together with alkyl acrylate compounds and hydroxyalkyl acrylate compounds, whereby it becomes possible to provide a suitable glass transition temperature ($T_g$) for the resin composition. The third polymerizable substance consists of at least one type of chemical compound selected from the group of chemical compounds including 1 to 8 carbon atom alkyl group possessing alkyl methacrylate compounds and 2 to 8 carbon atom hydroxyalkyl group possessing hydroxyalkyl methacrylate compounds. Examples of chemical compounds which may suitably be incorporated into the third polymerizable substance include methyl methacrylate, ethyl methacrylate, n-propyl methacrylate, isopropyl methacrylate, n-butyl methacrylate, sec-butyl methacrylate, t-butyl methacrylate, 2-hydroxy ethyl methacrylate, 2-hydroxy propyl methacrylate and 2-ethyl hexyl methacrylate. Among the aforementioned chemical compounds, methyl methacrylate generally provide the best performance. The third polymerizable substance constituted as described above should account for 10 to 75 weight % of the above mentioned thermoplastic resin component A, and preferably 15 to 70 weight thereof.

The above mentioned fourth polymerizable substance serving as one of the four components making up thermoplastic resin component A consists of at least one type of chemical compound selected from the group of chemical compounds including styrene compounds and ring substituted styrene compounds, where styrene compounds are those described by general chemical structure diagram I below:

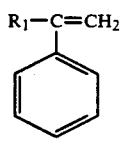

I where $R_1$ represents a hydrogen atom, halogen atom, or an alkyl group having 1 to 6 carbon atoms. When ring substituted styrene compounds are employed, any or all of carbon atoms $C_2$ through $C_6$ may substituted, with suitable substituents including nitro groups, alcoxy groups, acyl groups, carboxyl groups, sulfone groups, hydroxyl groups and halogen atoms, and preferably, simple alkyl groups such as methyl and t-butyl groups. Of all the chemical compounds described above, the component of thermoplastic resin component A generally providing the best performance is styrene. The fourth polymerizable substance constituted as described above should account for 0 to 45 weight % of the above mentioned thermoplastic resin component A, and preferably 0 to 40 weight % thereof. When the fourth polymerizable substance is included in an amount of greater than 45 weight % of thermoplastic resin component A, the developing time and the time required to remove the hardened resin after completion of etching or plating is too long and when the fourth polymerizable substance included in an amount greater than 45 weight % and the resin composition finally produced is used to produce dry film resist, definition of the resist pattern obtained suffers, resulting in poor quality printed circuit boards produced therefrom.

As with thermoplastic resin component A, the above mentioned thermoplastic resin component B is also made up of first, second, third and fourth polymerizable substances. The first polymerizable substance of thermoplastic resin component B comprises at least one type of chemical compound consisting of $\alpha$, $\beta$-unsaturated, carboxyl group possessing monomer having 3 to 15 carbon atoms per monomer molecule, and preferably 3 to 6 carbon atoms per monomer molecule. Examples of suitable compounds which may be used in the first polymerizable substance of thermoplastic resin component B are the same as those for thermoplastic resin component A. The first polymerizable substance should account for 15 to 35 weight % of thermoplastic resin component B, and preferably 18 to 30 weight % thereof. When included in an amount of less than 15 weight % of thermoplastic resin component B, development is not achieved by the alkaline aqueous solution or requires too long a period of time, thus resulting in poor definition of the resist pattern. When the first polymerizable substance is included in an amount of greater than 35 weight % of thermoplastic resin component B, development occurs too rapidly, and the process is thus difficult to control. Additionally, under such circumstances, the ability of the cross-linked hardened portions to withstand the alkaline aqueous solution may be decreased.

The second polymerizable substance serving as one of the four components making up thermoplastic resin component B consists of at least one type of chemical compound selected from the group of chemical compounds including 1 to 8 carbon atom alkyl group possessing alkyl acrylate compounds and 2 to 8 carbon atom hydroxyalkyl group possessing hydroxyalkyl acrylate compounds. Examples of suitable compounds which may be used in the second polymerizable substance of thermoplastic resin component B are the same as those for thermoplastic resin component A. In order to provide optimal flexibility characteristics for the cross-linking hardenable resin composition of the present invention, the second polymerizable substance should account for 5 to 30 weight % of the above mentioned thermoplastic resin component B, and preferably 7 to 25 weight % thereof. When included in an amount of less than 5 weight % of thermoplastic resin component B, dry film resist prepared therefrom is not sufficiently flexible, for which reason sufficient adherence to the metal baseplate and conformation to irregularities in the surface thereof is not obtained and ability to withstand etching fluid and plating fluid is decreased. When the second polymerizable substance is included in an amount of greater than 30 weight % of thermoplastic resin component B, dry film resist prepared therefrom ends up being overly soft, for which reason there is a tendency for these resin components to ooze from the ends of rolls of dry film resist incorporating the resin composition, that is, the cold flow phenomena tends to occur.

The above mentioned third polymerizable substance serving as one of the four components making up thermoplastic resin component B becomes incorporated into co-polymers together with alkyl acrylate compounds and hydroxyalkyl acrylate compounds, whereby it becomes possible to provide a suitable glass transition temperature ($T_g$) for the resin composition. The third polymerizable substance consists of at least one type of chemical compound selected from the group of chemical compounds including 1 to 8 carbon atom alkyl group possessing alkyl methacrylate compounds and 2 to 8 carbon atom hydroxyalkyl group possessing hydroxyalkyl methacrylate compounds. Examples of suitable compounds which may be used in the third polymerizable substance of thermoplastic resin component B are the same as those for thermoplastic resin component A. The third polymerizable substance should account for 10 to 80 weight % of the above mentioned thermoplastic resin component A, and preferably 15 to 75 weight % thereof.

The above mentioned fourth polymerizable substance serving as one of the four components making up thermoplastic resin component B consists of at least one type of chemical compound selected from the group of chemical compounds including styrene compounds and ring substituted styrene compounds, where styrene compounds are those described by general chemical structure diagram II below:

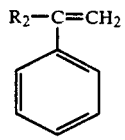

II where $R_2$ represents a hydrogen atom, halogen atom, or an alkyl group having 1 to 6 carbon atoms. When ring substituted styrene compounds are employed, any or all of carbon atoms $C_2$ through $C_6$ may substituted, with suitable substituents including nitro groups, alcoxy groups, acyl groups, carboxyl groups, sulfone groups, hydroxyl groups and halogen atoms, and preferably, simple alkyl groups such as methyl and t-butyl groups. Of all the chemical compounds described above, the component of thermoplastic resin component B generally providing the best performance is styrene.

The fourth polymerizable substance should account for 0 to 45 weight % of thermoplastic resin component B, and preferably 0 to 40 weight % thereof. When the fourth polymerizable substance is included in an amount of greater than 45 weight % of thermoplastic resin component B, the developing time and the time required to remove the hardened resin after completion of etching or plating is too long. Additionally, when the fourth polymerizable substance included in an amount greater than 45 weight % and the resin composition finally produced is used to produce dry film resist, definition of the resist pattern obtained suffers, resulting in poor quality printed circuit boards produced therefrom.

To achieve the object of the present invention, the monomers which when polymerized form thermoplastic resin component A and thermoplastic resin component B must be those as have been specified above. Moreover, to fully realize the object of the present invention, the polymers constituting thermoplastic resin component A and thermoplastic resin component B must have an average molecular weight within the range of 75,000 to 200,000. If the average molecular weight of these polymers is less than 75,000, cold flow is likely to occur in dry film resist comprising resin compositions prepared using such thermoplastic resin component A and/or thermoplastic resin component B. Conversely, if the average molecular weight of these polymers is greater than 200,000, poor definition results in resist patterns obtained upon development of resist layers prepared therefrom with weak aqueous alkaline solution following selective exposure of the resist layers to a suitable form of radiant energy. Additionally, development requires an exceedingly long period of time.

In order for the cross-linking hardenable resin composition of the present invention to have suitable resistance to cold flow at room temperature, and moreover, in order to provide a cross-linking hardenable resin composition which conforms to irregularities in the baseplate during lamination and tightly adheres to the baseplate following lamination, it is necessary that the glass transition temperature ($T_g$) as measured by differential scanning calorimetry (DSC) for thermoplastic resin component A be in the range of 66 to 88° C., and preferably in the range of 70 to 88° C., and that for thermoplastic resin component B be in the range of 92 to 120° C., and preferably in the range of 92 to 110° C. If $T_g$ for thermoplastic resin component A is less than 66° C., and/or $T_g$ for thermoplastic resin component B is less than 92° C., cross-linking hardenable resins incorporating these thermoplastic resin components will be too soft, for which reason cold flow is likely to occur. Conversely, if $T_g$ for thermoplastic resin component A is greater than 88° C., and/or $T_g$ for thermoplastic resin component B is greater than 120° C., cross-linking hardenable resins incorporating these thermoplastic resin components will be too hard, for which reason dry film resist manufactured therefrom will not adequately conform to irregularities in the baseplate during lamination and will not sufficiently adhere to the baseplate following lamination, thereby leading to the formation of pockets and crevices between the resist layer and the metal baseplate to which it is laminated.

Of the two different types of thermoplastic resin component, thermoplastic resin component A and thermoplastic resin component B, incorporation of thermoplastic resin component A which generally has the lower value for $T_g$ of the two provides for the improvement of the characteristics of conformation to irregularities in the baseplate and tight adherence to the baseplate, but also tends to promote cold flow during storage. Conversely, thermoplastic resin component B lends resistance to cold flow during storage, but also tends to degrade the characteristics of conformation to irregularities in the baseplate and tight adherence to the baseplate. When both thermoplastic resin component A and thermoplastic resin component B are incorporated together in suitable amounts, the resulting cross-linking hardenable resin composition conforms exceedingly well to irregularities in the baseplate during lamination and tightly adheres to the baseplate following lamination. Moreover, such a cross-linking hardenable resin composition demonstrates excellent resistance to cold flow under storage at room temperature.

The exact mechanism whereby thermoplastic resin component A and thermoplastic resin component B interact to achieve the above described characteristics is not clear. It has been found, however, that with a cross-linking hardenable resin composition manufactured using only a single type of thermoplastic resin as a binder resin, improved characteristics of conformation to irregularities in the baseplate and tight adherence to the baseplate with simultaneous resistance to cold flow during storage cannot be achieved, even when the kind and content of monomer units of the above thermoplastic resin are totally of the kind and content as those of blended thermoplastic resins A and B of the present invention. Additionally, it has been found that unless the values of $T_g$ for thermoplastic resin component A and thermoplastic resin component B are within the above described limits, improved characteristics of conformation to irregularities in the baseplate and tight adherence to the baseplate with simultaneous resistance to cold flow during storage cannot be achieved.

As described previously, the fourth polymerizable substances employed as a styrene type co-polymer component in thermoplastic resin component A and that employed in thermoplastic resin component B as shown in general chemical structure diagrams I and II, respectively, each should account for 0 to 45 weight % of the respective thermoplastic resin component, and preferably 0 to 40 weight % thereof. Moreover, it is desirable that either thermoplastic resin component A or thermoplastic resin component B does not contain any of the fourth polymerizable substance. When only styrene type monitor unit containing thermoplastic resins are employed, the chemical resistance of dry film resist prepared therefrom is quite good, however, the required time for development and for removing the hardened resin after completion of etching or plating is too long. On the other hand, if only thermoplastic resins which contain no styrene type monitor units are employed, with dry film resist prepared therefrom, while the development time is shortened, chemical resistance, for example, resistance to plating fluid suffers. Under these circumstances, the ability to withstand chemicals, for example plating fluid, also suffers. In contrast, if a thermoplastic resin component which contains no styrene and one which does contain styrene are used in unison, and the binder resin prepared therefrom is used to manufacture the cross-linking hardenable resin composition of the present invention, dry film resist can be produced using the cross-linking hardenable resin composition thus prepared which provides excellent chemical resistance and development properties.

The binder resin incorporated into the cross-linking hardenable resin composition of the present invention, is comprised of a mixture of the thermoplastic resin component A to thermoplastic resin component B which have been described in detail in the above. The ratio by weight of thermoplastic resin component A to thermoplastic resin component B in the binder resin composed thereof should be in the range of 1:9 to 9:1, and preferably in the range of 2:8 to 8:2. When the ratio by weight of thermoplastic resin component A to thermoplastic resin component B is less than 1:9, the ability of the resin composition incorporating the resulting binder resin to conform to irregularities in the surface of the baseplate during lamination and to tightly adhere to the baseplate following lamination suffers. Conversely, when the ratio by weight of thermoplastic resin component A to thermoplastic resin component B is greater than 9:1, cold flow at room temperature tends to occur with rolls of dry film resist incorporating the resulting resin composition.

With the cross-linking hardenable resin composition of the present invention, the binder resin comprised of thermoplastic resin component A and thermoplastic resin component B as described above should constitute 45 to 75 weight % of the cross-linking hardenable resin composition, and preferably 50 to 70 weight % thereof. When the binder resin is employed at less than 45 weight % of the cross-linking hardenable resin composition, it lacks the ability to maintain the manufactured resin layer configuration and there is a tendency for cold flow to occur at room temperature. Additionally, it takes a long time to remove the resist layer from the base plate following etching with such dry film resist. Conversely, when the binder resin is employed at greater than 75 weight % of the cross-linking hardenable resin composition, the resin composition does not readily conform to irregularities in the baseplate, adherence is poor, and chemical resistance, particularly resistance to etching fluid and plating fluid is insufficient.

In addition to the binder resin comprised of thermoplastic resin component A and thermoplastic resin component B, another essential component of the cross-linking hardenable resin composition of the present invention is at least one type of cross-linking monomer, where each molecule of cross-linking monomer includes at least two carbon-carbon double bonds. Suitable examples of chemical compounds which may be used as cross-linking monomer in the present invention include polyethylene glycol di(meth)acrylate, where di(meth)acrylate indicates both the diacrylate and dimethacrylate. This convention will be used throughout the specification. Other examples include polypropylene glycol di(meth)acrylate, 1,3-butanediol di(meth)acrylate, 1,6-hexanediol di(meth)acrylate, neopentyl glycol di(meth)acrylate, 2,2-bis(4-(meth)acryloxy polyethoxy phenyl)propane, 2,2-bis(4-(meth)acryloxy polypropylene oxyphenyl)propane, hydroxy pivalate neopentyl glycol di(meth)acrylate, glycerin di(meth)acrylate, glycerin tri(meth)acrylate, trimethylol ethane di(meth)acrylate, trimethylol ethane tri(meth)acrylate, trimethylol propane di(meth)acrylate, trimethylol propane tri(meth)acrylate, trimethylol propane tris(polyethoxy(meth)acrylate), trimethylol propane tris(polypropylene oxy(meth)acrylate), isocyanurate triethylol di(meth)acrylate, isocyanurate triethylol tri(meth)acrylate, pentaerythritol di(meth)acrylate, pentaerythritol tri(meth)acrylate, pentaerythritol tetra(meth)acrylate, dipentaerythritol tri(meth)acrylate, dipentaerythritol tetra(meth)acrylate, dipentaerythritol penta(meth)acrylate, dipentaerythritol hexa(meth)acrylate, epoxy (meth)acrylates, urethane (meth)acrylates and mixtures of two or more of the above.

For the cross-linking monomers and mixtures thereof, for which each molecule of cross-linking monomer includes at least two carbon-carbon double bonds, it is desirable that this compound or mixture of compounds include at 51 to 100 weight %, and preferably at 51 to 95 weight %, at least one compound as described by general chemical structure diagram III below:

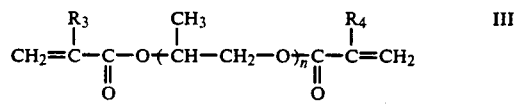

where $R_3$ and $R_4$ each represent a hydrogen atom or methyl group, and n is an integral value between 5 and 9, inclusive.

By including a suitable amount of one or more chemical compounds encompassed by general chemical structure diagram III above in the cross-linking hardenable resin composition of the present invention, desirable hardening properties are imparted to the resin composition. Moreover, due to the hydrophilic nature of compounds represented by general chemical structure diagram III above, a cross-linking hardenable resin composition which includes one or more of these compounds is partially hydrophilic. When hardened resist containing such a compound is treated with an aqueous base, water penetrates and the hardened resist softens and swells, but not uniformly, for which reason internal pressure gradients build up and the hardened resist can be easily stripped away. Because the compounds are partially hydrophobic, the hardened resist only softens, but does not dissolve, thus allowing the hardened resist to be stripped away as pieces thereof, thereby facilitating the stripping process.

As mentioned above, the cross-linking monomer component of the cross-linking hardenable resin composition of the present invention should include 51 to 100 weight % thereof of at least one compound as described by general chemical structure diagram III, and preferably at 51 to 95 weight %. When the total amount of these compounds is included at less than 51 weight % of the total amount of cross-linking monomer, the time required to strip hardened resist of the resulting resin composition from a metal baseplate using an aqueous alkaline solution is markedly lengthened, while at the same time, the hardened resist is overly soluble in the aqueous alkaline solution, for which reasons the stripping solution tends to turn to gel before the stripping is completed. Various problems then result such as redeposition of the resin composition on the circuit board and various maintenance problems such as clogged filters and lines in the stripping fluid circulating system, thus generally lowering production and increasing manufacturing costs.

As noted in the description of general chemical structure diagram III, n should be an integral value between 5 and 9. For compounds for which n is less than 4, the cross-linkage density of the hardened resin composition tends to be too high, for which reason stripping takes a very long time, and furthermore, during stripping, the hardened resin tends to separate from the board as fine particulate matter, leading to maintenance problems in the stripping fluid circulation system as described above, and also quickly exhausting the stripping fluid. When n is greater than 9, the resulting resin composition does not adequately harden, chemical resistance thereof is poor, and the resin tends to strip off in overly large pieces which can jam rollers and other mechanical components in conveyor system of the stripping apparatus.

Actual examples of compounds represented by general chemical structure diagram III include pentapropylene glycol di(meth)acrylate, hexapropylene glycol di(meth)acrylate, heptapropylene glycol di(meth)acrylate, octapropylene glycol di(meth)acrylate, nonapropylene glycol di(meth)acrylate, commercially marketed compounds such as NK-Ester 9PG and NK-Ester APG-400 (Shinnakamura Chemical Industrial Co., Ltd). As mentioned previously, these compounds can be used independently, or as mixtures of two or more.

Other examples of cross-linking monomers for which each molecule of cross-linking monomer includes at least two carbon-carbon double bonds, and which are applicable to the cross-linking monomer component of the resin composition of the present invention, alone or in combination, include those compounds encompassed by general chemical structure diagrams IV and V below:

eral chemical structure diagrams IV and V. Because the chemical compounds encompassed by general chemical structure diagrams IV and V have at least two hydroxy groups per molecule, hardened resists of the resulting resin compositions are readily permeable to the aqueous alkaline solution used in stripping, for which reason such resin compositions tend to have excellent stripping behavior. When the total amount of included cross-linking monomer encompassed by general chemical structure diagrams IV and V is less than 5 weight % of the total amount of cross-linking monomer employed, there is a tendency for the resulting resin compositions to have less than optimal stripping characteristics. When the total amount of these cross-linking monomers is greater than 49 weight % of the total amount of cross-linking monomer employed, the resulting hardened resist is overly soluble in the aqueous alkaline solution, leading to the problems previously described for such a case.

Actual examples of compounds represented by general chemical structure diagram IV include dual functional epoxy di(meth)acrylates, for example, ethylene glycol diglycidyl ether di(meth)acrylate, diethylene glycol diglycidyl ether di(meth)acrylate, triethylene glycol diglycidyl ether di(meth)acrylate, propylene glycol diglycidyl ether di(meth)acrylate, dipropylene glycol diglycidyl ether di(meth)acrylate and tripropylene glycol diglycidyl ether di(meth)acrylate. Commercially marketed examples include Denacol Acrylate DM-811, Denacol Acrylate DM-851, Denacol Acrylate DA-911 and Denacol Acrylate DA-920 (Nagase Chemicals Ltd).

Examples of compounds represented by general chemical structure diagram V include tri functional epoxy tri(meth)acrylates, for example, glycerol triglycidyl ether tri(meth)acrylate, trimethylol ethane triglycidyl ether tri(meth)acrylate, trimethylol propane triglycidyl ether tri(meth)acrylate, fluoro glucinol diglycidyl ether tri(meth)acrylate, and preferably, glycerol triglycidyl ether tri(meth)acrylate, trimethylol ethane triglycidyl ether tri(meth)acrylate and trimethylol propane triglycidyl ether tri(meth)acrylate. Commercially marketed examples include Denacol Acrylate DA-314 (Nagase Chemicals Ltd).

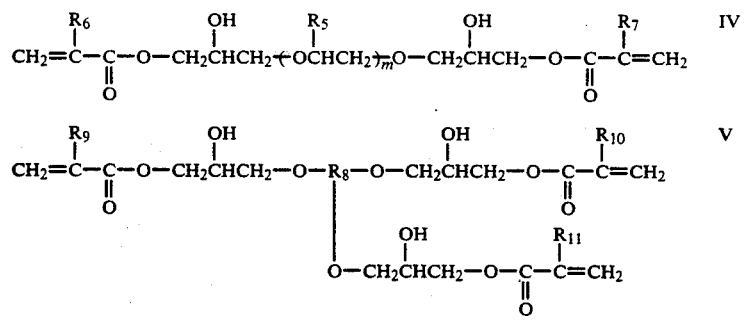

where $R_5$, $R_6$ and $R_7$ in structural diagram IV and $R_9$, $R_{10}$ and $R_{11}$ in structural diagram V each represent a hydrogen atom or methyl group, $R_8$ in structural diagram V represents a 3 to 15 carbon atom organic residue, and m in structural diagram IV is an integral value between 1 and 11, inclusive.

The cross-linking monomer component of the cross-linking hardenable resin composition of the present invention should preferably include 5 to 49 weight % thereof of at least one compound as described by gen- Although it is possible to use one of the compounds represented by general chemical structure diagram IV or V, generally, two or more such compounds is preferable.

The cross-linking hardenable resin composition of the present invention should include 25 to 55 weight % of at least one of the various cross-linking monomer compounds described above, and preferably 30 to 50 weight % thereof. When included in an amount of less than 25 weight %, light induced hardening thereof is insufficient, and chemical resistance then suffers, particularly resistance to plating fluid and etching fluid. When included in an amount greater than 55 weight %, cold flow at room temperature tends to be problematic, and stripping characteristics in aqueous base also suffer.

Examples of the photopolymerization initiator incorporated into the cross-linking hardenable resin composition of the present invention include one or more compounds from among the group of compounds including benzophenone, Michler's ketone, 4,4'-bis(diethylamino) benzophenone, t-butyl anthraquinone, 2-ethyl anthraquinone, thioxanthones, benzoin alkyl ethers and benzyl ketals.

In the case where an ultraviolet light hardening photopolymerization initiator is incorporated into the cross-linking hardenable resin composition of the present invention, this compound should constitute 0.1 to 10 parts by weight per 100 parts by weight of resin composition. When used in an amount of less than 0.1 parts by weight, insufficient light induced hardening is achieved. When used in an amount of greater than 10 parts by weight, the resin composition becomes thermally unstable. When polymerization and hardening of the cross-linking hardenable resin composition of the present invention is to be initiated using an electron beam, the above described photopolymerization initiator can be omitted.

In order to control the degree of cross-linking so as to obtain the desired amount of hardness with the cross-linking hardenable resin composition of the present invention, cross-linking monomer having only one carbon-carbon double bond per molecule thereof can be added in a suitable amount. Examples of such compounds include phenoxy diethoxy (meth)diacrylate, methoxy polyethylene glycol (meth)diacrylate, n-butoxy methyl acrylamide, isobutoxy methyl acrylamide, and mixtures thereof. When adding such compounds, they should be added in an equal weight or less in comparison with the previously described cross-linking monomer having two carbon-carbon double bonds per molecule thereof. When more than the above proscribed limit is added, cross-linking density is insufficient, for which reason chemical resistance suffers.

To enhance adherence of plating metals to the baseplate surface, tetrazoles and substituted tetrazoles can be added in small amounts. Such compounds include 1-phenyl tetrazole, 5-phenyl tetrazole, 5-amino tetrazole, 5-amino 1-methyl tetrazole, 5-amino 2-phenyl tetrazole, 5-mercapto 1-phenyl tetrazole, 5-mercapto 1-methyl tetrazole, and combinations thereof. Additional additives to improve plating characteristics include benzotriazole and benzimidazole among others. These last listed compounds must be added in a large quantity to enhance the above described adherence characteristics, but when a large quantity is included in the cross-linking hardenable resin composition of the present invention, there is a tendency for the sensitivity to initiation of polymerization to deteriorate, poor durability of plating due to additive residues on the copper surface, and delayed etching, which are all undesirable. When adding tetrazoles and substituted tetrazoles, the added amount should be 0.005 to 5 parts by weight per 100 parts of the total amount of binder resin, cross-linking monomer and photopolymerization initiator. When less than 0.005 parts by weight are added, little improvement is observed in plating properties, whereas when greater than 5 parts by weight are added, the time required to dissolving these compounds into the photopolymerizable resin composition is prolonged.

Thermal polymerization inhibitor, dyes, plasticizer, filler, etc. can be added as necessary to the cross-linking hardenable resin composition of the present invention.

In the manufacture of dry film resist incorporating the resin composition of the present invention, the resin composition can be applied using a blade coater, rod coater, knife coater, roll doctor coater, comma coater, reverse roll coater, transfer coater, gravure coater, kiss roll coater and curtain coater, among other means. In the present invention, the resin composition can be applied as described above without dilution, or may be diluted as desired using a suitable solvent. When solvents are employed, however, an additional drying step is required. As a support layer, polyester and other types of plastic film are ordinarily used. For drying the applied resin layer, when flammable organic solvents have been employed, forced air drying can be accomplished using a drying apparatus designed for use in the presence of flammable vapors.

After the film has been dried, if necessary, a protective layer of polyethylene or polypropylene can be applied over the resin composition layer.

With dry film resist manufactured as described above, cold flow does not readily occur at room temperature, and such dry film resist conforms well to irregularities in the surface of the baseplate to which it is laminated, and adheres tightly thereto. With this dry film resist, high definition plating and etching can be achieved using high efficiency, high yield industrial processes, with minimal labor requirements and expense.

In the following, concrete examples of the preparation and application of the resin composition of the present invention will be described.

Preparation of Example Thermoplastic Resins

A 1000 ml four neck flask was fitted with a stirrer, nitrogen inlet, thermometer and condenser. Under a nitrogen atmosphere, 100 g of isopropyl alcohol, 100 g of methyl ethyl ketone, along with 200 g of monomers indicated by Table 1 were added to the flask, after which the temperature was raised to 80° C. while stirring. Then 1.0 g of azobisisobutyronitrile dissolved in 10 g of isopropyl alcohol was added, and polymerization was allowed to take place over 4 hours. Next, 1.0 g of azobisisobutyronitrile dissolved in 10 g of isopropyl alcohol was added in 5 equal aliquots at 30 minute intervals. The contents of the flask were then heated to the boiling point thereof, and the temperature was thus maintained for 2 hours. After completion of polymerization, 100 g of isopropyl alcohol was added, and the polymerization reaction mixture was removed from the flask. By this method, each of the thermoplastic resin compositions A-1 through C-4 shown in Table 1 were prepared. For each trial shown in Table 1, conversion was at least 99.5% and solidification in the solvent was 38.7 weight %. The average molecular weight for each was in the range of 5,000 to 120,000. The $T_g$ for each polymer as measured by DSC is shown in Table 1.

Each of sample thermoplastic resins A-1, B-1 and C-1 prepared as described above, were used to prepare various photopolymerizing resin compositions as indicated in Table 2.

Using a propeller type mixer, the resin compositions thus prepared were stirred, after which each resin composition was spread over a respective length of 25 μm thick, 360 mm wide polyester film using a blade coater at a longitudinal application rate of 2 m/min, thereby preparing 340 mm wide layers of each resin composition. These preparations were then placed in a 400 mm wide, 100 mm high, 8 m long drying apparatus and were dried with blowing heated air at 90° C. The resulting dried layers of resin composition on polyester film had a thickness of 50 μm. Each layer thus prepared was then laminated with a 35 μm thick layer of polyester protective film. A 120 m length of each of the resulting tri-layer laminates was then rolled into a respective roll, and each roll was set on its side in a 23° C. constant temperature chamber for two weeks, whereupon the ends of the rolls were examined for cold flow. These results are shown in Table 2.

Next, each resin composition was evaluated as to its ability to conform to irregularities in the surface of a metal baseplate. First of all, 23 μm deep, 68 μm wide V-shaped grooves were inscribed in the copper foil of 3.5 cm wide by 5.0 cm long copper clad boards, over which respective samples of the above prepared dry film resists were laminated while peeling away the protective layer. Lamination was carried out at a rate of 2.0 m/min, at a temperature of 90° C. without preheating and at a pressure of 3.0 kg/cm². The laminate was then exposed to light so as to form a 5 strip resist pattern of 80 μm wide strips overlying and perpendicular to the above described groove, after which development was carried out. After development, the board was dipped in 50° C. aqueous ferrous chloride solution, whereby etching was effected, after which the resist layer was stripped using aqueous sodium hydroxide. Finally, the resulting pattern obtained from the above process was examined by microscope for breaks and narrowings in the copper strips. These results are shown in Table 2.

Each of sample thermoplastic resins A-2, B-2 and C-2 prepared as described previously were used to prepare various photopolymerizing resin compositions as indicated in Table 3. Dry film resist were then prepared by the same method explained for Example 1. The samples were then examined for cold flow and tested for conformation of the respective resin compositions to grooves inscribed in sample copper clad boards, again by the same methods as explained for Example 1. The results are shown in Table 3.

Each of sample thermoplastic resins A-3, B-3 and C-3 prepared as described previously were used to prepare various photopolymerizing resin compositions as indicated in Table 4. Dry film resists were then prepared by the same method explained for Example 1. The samples were then examined for cold flow and tested for conformation of the respective resin compositions to grooves inscribed in sample copper clad boards, again by the same methods as explained for Example 1. The results are shown in Table 4.

TABLE 1

| Thermoplastic resin | Polymerizable Monomer Composition (% by weight) | | | | | | T g (°C.) |
|---|---|---|---|---|---|---|---|
| | Methacrylic acid | Methyl acrylate | ethyl acrylate | n-butyl acrylate | Methyl-meth acrylate | Styrene | |
| A-1 | 20 | — | 23 | — | 57 | — | 77 |
| B-1 | 26 | 14 | — | — | 60 | — | 104 |
| C-1 | 23 | 7 | 11.5 | — | 58.5 | — | 90 |
| A-2 | 24 | — | — | 14 | 46 | 16 | 86 |
| B-2 | 22 | 20 | — | — | 50 | 8 | 94 |
| C-2 | 23 | 10 | — | 7 | 48 | 12 | 90 |
| A-3 | 21 | 27 | — | — | 38 | 14 | 84 |
| B-3 | 25 | 19 | — | — | 56 | — | 97 |
| C-3 | 23 | 23 | — | — | 47 | 7 | 91 |
| A-4 | 21 | — | 20 | — | 59 | — | 83 |
| B-4 | 25 | 18 | — | — | 47 | 10 | 98 |
| C-4 | 23 | 9 | 10 | — | 53 | 5 | 90 |

TABLE 2

| | EXAMPLE | | | COMPARATIVE EXAMPLE | | |
|---|---|---|---|---|---|---|
| | 1 | 2 | 3 | 1 | 2 | 3 |
| COMPOSITION (PARTS BY WEIGHT) | | | | | | |
| Thermoplastic Resin Solution A-1 (*1) | 75 | 112 | 38 | 150 | | |
| Thermoplastic Resin Solution B-1 (*1) | 75 | 38 | 112 | | 150 | |
| Thermoplastic Resin Solution C-1 (*1) | | | | | | 150 |
| Trimethylol propane triacrylate | 25 | 25 | 25 | 25 | 25 | 25 |
| Polyethylene glycol diacrylate (*2) | 10 | 10 | 10 | 10 | 10 | 10 |
| Benzophenone | 6 | 6 | 6 | 6 | 6 | 6 |
| Michler's ketone | 1 | 1 | 1 | 1 | 1 | 1 |
| Methylene Blue | 0.2 | 0.2 | 0.2 | 0.2 | 0.2 | 0.2 |
| RESULT | | | | | | |
| Cold flow | NO | NO | NO | YES | NO | Slight |
| Conformation of resin to surface irregularities during lamination (*3) | complete breaks 0 partial narrowings 0 | 0 0 | 0 0 | 0 0 | 5 0 | 0 3 |

(*1) All thermoplastic resin solutions include solid matter at 38.7% by weight. Accordingly, 150 parts by weight of thermoplastic resin solution contain 58.0 parts by weight of solid matter.
(*2) Tradename NK Ester A-400 Shinnakamura Chemical Industrial Co., Ltd.
(*3) The numeral indicates the number of defective strips out of the 5-strip pattern.
Complete breaks: copper strips with complete breaks
Partial narrowings: copper strips with partial narrowings

TABLE 3

| | Example 4 | Comparative Examples | | |
|---|---|---|---|---|
| | | 4 | 5 | 6 |
| COMPOSITION (PARTS BY WEIGHT) | | | | |
| Thermoplastic Resin Solution A-2 (*1) | 75 | 150 | | |
| Thermoplastic Resin Solution B-2 (*1) | 75 | | 150 | |
| Thermoplastic Resin Solution C-2 (*1) | | | | 150 |
| Trimethylol propane triacrylate | 25 | 25 | 25 | 25 |
| Polyethylene glycol diacrylate (*2) | 10 | 10 | 10 | 10 |
| Benzophenone | 6 | 6 | 6 | 6 |
| Michler's ketone | 1 | 1 | 1 | 1 |
| Methylene Blue | 0.2 | 0.2 | 0.2 | 0.2 |
| RESULT | | | | |
| Cold flow | NO | YES | NO | SLIGHT |
| Conformation of resin to sur- | complete breaks 0 | 0 | 1 | 0 |

TABLE 3-continued

|  |  | Example 4 | Comparative Examples | | |
|---|---|---|---|---|---|
|  |  |  | 4 | 5 | 6 |
| face irregularities during lamination (*3) | partial narrowings | 0 | 0 | 4 | 2 |

(*1) All thermoplastic resin solutions include solid matter at 38.7% by weight. Accordingly, 150 parts by weight of thermoplastic resin solution contain 58.0 parts by weight of solid matter.
(*2) Tradename NK Ester A-400 Shinnakamura Chemical Industrial Co., Ltd.
(*3) The numeral indicates the number of defective strips out of the 5-strip pattern.
Complete breaks: copper strips with complete breaks
Partial narrowings: copper strips with partial narrowings $kg/cm^2$ from a distance of 10 cm. During development of each sample, the time at which portions of the copper foil first became exposed to the atmosphere (minimum development time) was measured. These results are shown in Table 4.

The sample boards were then immersed in 30° C. degreasing solution (Metex 9268, MacDermid) for three minutes, after which they were sprayed with water for one minute. The boards were then dipped for one minute in 20% aqueous ammonium persulphate, and again sprayed with water for one minute. The boards were then dipped for one minute in 10% aqueous sulfuric acid, followed by spraying with water for one minute.

TABLE 4

|  | EXAMPLE | | | | | | | | COMPARATIVE EXAMPLE | | |
|---|---|---|---|---|---|---|---|---|---|---|---|
|  | 5 | 6 | 7 | 8 | 9 | 10 | 11 | 12 | 7 | 8 | 9 |
| COMPOSITION (PARTS BY WEIGHT) | | | | | | | | | | | |
| Thermoplastic A-3 (*1) | 75 | 112 | 38 | 75 | 75 | 75 | 75 | 75 | 150 | | |
| Resin B-3 (*1) | 75 | 38 | 112 | 75 | 75 | 75 | 75 | 75 | | 150 | |
| Solution C-3 (*1) | | | | | | | | | | | 150 |
| Trimethylol propane triacrylate | 25 | 25 | 25 | 10 | 10 | 10 | 5 | 5 | 25 | 25 | 25 |
| Polyethlyne glycol diacrylate (*2) | 10 | 10 | 10 | | | | | | 10 | 10 | 10 |
| Heptapropylene glycol diacrylate (*3) | | | | 25 | | | 20 | 20 | | | |
| Heptapropylene glycol dimethacrylate | | | | | 25 | | | | | | |
| Pentapropylene glycol diacrylate | | | | | | 25 | | | | | |
| Proplylene glycol diglycidyl ether diacrylate (*4) | | | | | | | 10 | | | | |
| Glycerol triglycidyl ether triacrylate (*5) | | | | | | | | 10 | | | |
| Benzophenone | 6 | 6 | 6 | 6 | 6 | 6 | 6 | 6 | 6 | 6 | 6 |
| Michler's Ketone | 1 | 1 | 1 | 1 | 1 | 1 | 1 | 1 | 1 | 1 | 1 |
| Methylene blue | 0.2 | 0.2 | 0.2 | 0.2 | 0.2 | 0.2 | 0.2 | 0.2 | 0.2 | 0.2 | 0.2 |
| RESULT | | | | | | | | | | | |
| Cold flow | NO | NO | NO | NO | NO | NO | NO | NO | YES | NO | SLIGHT |
| Conformation of resin to surface irregularities during lamination (*6) complete breaks | 0 | 0 | 0 | 0 | 0 | 0 | 0 | 0 | 0 | 3 | 0 |
| partial narrowings | 0 | 0 | 0 | 0 | 0 | 0 | 0 | 0 | 0 | 2 | 4 |
| Minimum development time (sec) | 35 | 43 | 32 | 35 | 37 | 35 | 34 | 34 | 60 | 30 | 45 |
| Resistance to plating (*7) | ○ | ○ | ○ | ○ | ○ | ○ | ○ | ○ | ○ | X | Δ |
| Time required to strip (secs) | 95 | 113 | 88 | 55 | 60 | 65 | 45 | 45 | 150 | 85 | 118 |

(*1) All thermoplastic resin solutions include solid matter at 38.7% by weight. Accordingly, 150 parts by weight of thermoplastic resin solution contain 58.0 parts by weight of solid matter.
(*2) Tradename NK Ester A-400 Shinnakamura Chemical Industrial Co., Ltd.
(*3) Tradename NK Ester APG-400, Shinnakamura Chemical Industrial Co., Ltd.
(*4) Tradename Denacol Acrylate DA-911, Nagase Chemicals, Ltd.
(*5) Tradename Denacol Acrylate DA-314, Nagase Chemicals, Ltd.
(*6) The numeral indicates the number of defective strips out of the 5-strip pattern.
Complete breaks: copper strips with complete breaks
Partial narrowings: copper strips with partial narrowings
(*7) ○: Neither underplating, bridge formation, nor short circuiting observed; Δ: Underplating was observed; X: Bridging between conductive patterns was observed.

Further, the sample dry film resists were laminated to copper clad boards as described previously, and after the laminates cooled to room temperature, photo masks were tightly applied to the polyester film surface of the laminates, and the boards were then exposed to 100 $mJ/cm^2$ intensity ultraviolet radiation with an ultra high pressure mercury lamp (USH-102D, Ushio Electric). Intensity of the exposing illumination was measured using an ultraviolet exposure meter (UV-350, ORC). The support film was then peeled off of each sample 20 minutes after completion of UV exposure and the boards were then developed by spraying with 30° C. 1% aqueous sodium carbonate at a pressure of 1.4

The boards were then treated for 68 minutes in 22° C. copper sulphate plating solution at 2.3 $A/dm^2$. Immediately after completion of plating, the boards were washed in water, after which the boards were immersed in 15% aqueous borofluoric acid for one minute, and then treated for 17 minutes in 22° C. tin-lead plating solution at 1.8 $A/dm^2$. Immediately after completion of plating, the boards were washed in water, and then dried. The resistance to plating fluid demonstrated by the dry film resist of each sample was examined and the results are shown in Table 4. The composition of the copper plating solution and tin-lead plating solution used are as follows:

| Copper plating solution | |
|---|---|
| copper sulfate | 75 g/l |
| 98% sulfuric acid | 190 g/l |
| 36% hydrochloric acid | 0.12 ml/l |
| brightener | 5 ml/l |
| Tin-lead plating solution | |
| tin | 15 g/l |
| lead | 10 g/l |
| free borofluoric acid | 400 g/l |
| free boric acid | 21.6 g/l |
| peptone | 5.2 g/l |

After tin-lead plating, resin resist layer was stripped from the sample boards in 3% sodium hydroxide aqueous solution at 45° C. Stripping of resist from the boards was achieved using a spray nozzle to spray water at 1.0 kg/cm² from a distance of 10 cm. The time required to strip the resist layer was measured for each board and these results are shown in Table 4.

Each of sample thermoplastic resins A-4, B-4 and C-4 prepared as described previously were used to prepare various photopolymerizing resin compositions as indicated in Table 5. Dry film resists were then prepared by the same method explained for Example 1. The samples were then examined for cold flow and tested for conformation of the respective resin compositions to grooves inscribed in sample copper clad boards, again by the same methods as explained for Example 1. The results are shown in Table 5. Further, just as in Example 5, the minimal development time and plating fluid resistance characteristics were evaluated for each board, and these results are shown in Table 5 as well.

TABLE 5

| | EXAMPLE | | | | | | | | COMPARATIVE EXAMPLE | | |
|---|---|---|---|---|---|---|---|---|---|---|---|
| | 13 | 14 | 15 | 16 | 17 | 18 | 19 | 20 | 10 | 11 | 12 |
| COMPOSITION (PARTS BY WEIGHT) | | | | | | | | | | | |
| Thermoplastic A-4 (*1) | 75 | 75 | 75 | 75 | 75 | 75 | 67.18 | 78.81 | 150 | | |
| Resin B-4 (*1) | 75 | 75 | 75 | 75 | 75 | 75 | 67.18 | 78.81 | | 150 | |
| Solution C-4 (*1) | | | | | | | | | | | 150 |
| Trimethylol propane triacrylate | 25 | 10 | 10 | 10 | 5 | 5 | 28 | 22 | 25 | 25 | 25 |
| Polyethlyne glycol diacrylate (*2) | 10 | | | | | | 13 | 10 | 10 | 10 | 10 |
| Heptapropylene glycol diacrylate (*3) | | 25 | | | 20 | 20 | | | | | |
| Heptapropylene glycol dimethacrylate | | | 25 | | | | | | | | |
| Pentapropylene glycol diacrylate | | | | 25 | | | | | | | |
| Propylene glycol diglycidyl ether diacrylate (*4) | | | | | 10 | | | | | | |
| Glycerol triglycidyl ether triacrylate (*5) | | | | | | 10 | | | | | |
| Benzophenone | 6 | 6 | 6 | 6 | 6 | 6 | 6 | 6 | 6 | 6 | 6 |
| Michler's Ketone | 1 | 1 | 1 | 1 | 1 | 1 | 1 | 1 | 1 | 1 | 1 |
| Methylene blue | 0.2 | 0.2 | 0.2 | 0.2 | 0.2 | 0.2 | 0.2 | 0.2 | 0.2 | 0.2 | 0.2 |
| RESULT | | | | | | | | | | | |
| Cold flow | NO | NO | NO | NO | NO | NO | NO | NO | YES | NO | SLIGHT |
| Conformation of resin to surface irregularities during lamination (*6) | 0 complete breaks | 0 partial narrowings | 0 | 0 | 0 | 0 | 0 | 0 | 0 | 4 1 | 0 2 |
| Minimum development time (sec) | 35 | 35 | 37 | 35 | 34 | 34 | 40 | 34 | 30 | 55 | 43 |
| Resistance to plating (*7) | ○ | ○ | ○ | ○ | ○ | ○ | ○ | ○ | Δ | Δ | Δ |
| Time required to strip (secs) | 88 | 50 | 55 | 60 | 42 | 42 | 86 | 90 | 80 | 125 | 103 |

(*1) All thermoplastic resin solutions include solid matter at 38.7% by weight. Accordingly, 134.36, 150, and 157.62 parts by weight of thermoplastic resin solution contain 52.0, 58.0 and 61.0 parts by weight of solid matter, respectively.
(*2) Tradename NK Ester A-400 Shinnakamura Chemical Industrial Co., Ltd.
(*3) Tradename NK Ester APG-400, Shinnakamura Chemical Industrial Co., Ltd.
(*4) Tradename Denacol Acrylate DA-911, Nagase Chemicals, Ltd.
(*5) Tradename Denacol Acrylate DA-314, Nagase Chemicals, Ltd.
(*6) Trademark NK Ester APG-400, Shinnakamura Chemical Industrial Co. Ltd.
(*7) ○: Neither underplating, bridge formation, nor short circuiting observed; Δ: Underplating was observed; X: Bridging between conductive patterns was observed.

What is claimed is:

1. A cross-linking hardenable resin composition including a mixture of:
   a) 45 to 75 parts by weight of binder resin comprising thermoplastic resin A and thermoplastic resin B, where thermoplastic resin A and thermoplastic resin B each have a weight averaged molecular weight ranging from 75,000 to 200,000, and the ratio by weight of thermoplastic resin A to thermoplastic resin B is in the range of 1:9 to 9:1;
   b) 25 to 55 parts by weight of cross-linking monomer, where each molecule of cross-linking monomer includes at least 2 carbon-carbon double bonds; and
   c) 0 to 10 parts by weight of photopolymerization initiator, such that when the amount of each of said binder resin, cross-linking monomer and photopolymerization initiator making up said mixture is expressed in terms of parts by weight of said mixture, the total thereof equals 100; and such that said thermoplastic resin A in said binder resin has a glass transition temperature ($T_g$) measured by differential scanning calorimetry (DSC) in the range of 66 to 88° C., and is co-polymerized with a mixture of monomers comprising:

i) 15 to 35 % by weight thereof of first polymerizable substance, said first polymerizable substance in turn made up of at least one type of chemical compound consisting of $\alpha$, $\beta$-unsaturated, carboxyl group possessing monomer having 3 to 15 carbon atoms per monomer molecule;

ii) 10 to 55 % by weight thereof of second polymerizable substance, said second polymerizable substance being at least one type of chemical compound selected from the group of chemical compounds comprising 1 to 8 carbon atom alkyl group possessing alkyl acrylate compounds, and 2 to 8 carbon atom hydroxyalkyl group possessing hydroxyalkyl acrylate compounds;

iii) 10 to 75 % by weight thereof of third polymerizable substance, said third polymerizable substance being at least one type of chemical compound selected from the group of chemical compounds comprising 1 to 8 carbon atom alkyl group possessing alkyl methacrylate compounds, and 2 to 8 carbon atom hydroxyalkyl group possessing hydroxyalkyl methacrylate compounds; and iv) 0 to 45 % by weight thereof of fourth polymerizable substance, said fourth polymerizable substance being at least one type of chemical compound selected from the group of chemical compounds comprising styrene compounds and ring substituted styrene compounds, where styrene compounds are those described by general chemical structure diagram I below:

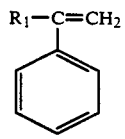

I where $R_1$ represents a hydrogen atom, halogen atom, or an alkyl group having 1 to 6 carbon atoms; and such that thermoplastic resin B in said binder resin has a $T_g$ as measured by DSC ranging from 92 to 120° C., and is co-polymerized with a mixture of monomers comprising:

v) 15 to 35 % by weight thereof of first polymerizable substance, said first polymerizable substance in turn made up of at least one type of chemical compound consisting of $\alpha$, $\beta$-unsaturated, carboxyl group possessing monomer having 3 to 15 carbon atoms per monomer molecule;

vi) 5 to 30 % by weight thereof of second polymerizable substance, said second polymerizable substance being at least one type of chemical compound selected from the group of chemical compounds comprising 1 to 8 carbon atom alkyl group possessing alkyl acrylate compounds, and 2 to 8 carbon atom hydroxyalkyl group possessing hydroxyalkyl acrylate compounds;

vii) 10 to 80 % by weight thereof of third polymerizable substance, said third polymerizable substance being at least one type of chemical compound selected from the group of chemical compounds comprising 1 to 8 carbon atom alkyl group possessing alkyl methacrylate compounds, and 2 to 8 carbon atom hydroxyalkyl group possessing hydroxyalkyl methacrylate compounds; and viii) 0 to 45 % by weight thereof of fourth polymerizable substance, said fourth polymerizable substance being at least one type of chemical compound selected from the group of chemical compounds comprising styrene compounds and ring substituted styrene compounds, where styrene compounds are those compounds described by general chemical structure diagram II below:

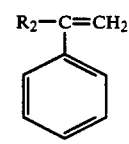

II where $R_2$ represents a hydrogen atom, halogen atom, or an alkyl group having 1 to 6 carbon atoms.

2. A cross-linking hardenable resin composition in accordance with claim 1 above, said cross-linking hardenable resin composition including a mixture of:

a) 50 to 70 parts by weight of binder resin comprising thermoplastic resin A and thermoplastic resin B, where thermoplastic resin A and thermoplastic resin B each have a weight averaged molecular weight ranging from 75,000 to 200,000, and the ratio by weight of thermoplastic resin A to thermoplastic resin B is in the range of 2:8 to 8:2;

b) 30 to 50 parts by weight of cross-linking monomer, where each molecule of cross-linking monomer includes at least 2 carbon-carbon double bonds; and c) 0.1 to 10 parts by weight of photopolymerization initiator, such that when the amount of each of said binder resin, cross-linking monomer and photopolymerization initiator making up said mixture is expressed in terms of parts by weight of said mixture, the total thereof equals 100; and such that said thermoplastic resin A in said binder resin has a glass transition temperature ($T_g$) measured by differential scanning calorimetry (DSC) in the range of 70 to 88° C., and each 100 parts by weight thereof is comprised of:

i) 18 to 30 % by weight thereof of first polymerizable substance, said first polymerizable substance in turn made up of at least one type of chemical compound selected from acrylic acid and methacrylic acid;

ii) 12 to 45 % by weight thereof of second polymerizable substance, said second polymerizable substance being at least one type of chemical compound selected from the group of chemical compounds comprising 1 to 8 carbon atom alkyl group possessing alkyl acrylate compounds;

iii) 15 to 70 % by weight thereof of third polymerizable substance, said third polymerizable substance being at least one alkyl methacrylate having a 1 to 8 carbon atom alkyl group; and iv) 0 to 40 % by weight thereof of fourth polymerizable substance, said fourth polymerizable substance being at least one type of chemical compound selected from styrene and ring substituted styrene; and such that thermoplastic resin B in said binder resin has a $T_g$ as measured by DSC ranging from 92 to 110° C., and is co-polymerized with a mixture of monomers comprising:

v) 18 to 30 % by weight thereof of first polymerizable substance, said first polymerizable substance in turn made up of at least one type of chemical compound selected from acrylic acid and methacrylic acid;

vi) 7 to 25 % by weight thereof of second polymerizable substance, said second polymerizable substance being at least one type of chemical compound selected from the group of chemical compounds comprising 1 to 8 carbon atom alkyl group possessing alkyl acrylate compounds;

vii) 15 to 75 % by weight thereof of third polymerizable substance, said third polymerizable substance being at least one type of chemical compound selected from the group of chemical compounds comprising 1 to 8 carbon atom alkyl group possessing alkyl methacrylate compounds; and viii) 0 to 40 % by weight thereof of fourth polymerizable substance, said fourth polymerizable substance being at least one type of chemical compound selected from the group of chemical compounds comprising styrene and ring substituted styrene.

3. A cross-linking hardenable resin composition in accordance with claim 1 above, wherein 3 to 45 parts by weight of said fourth polymerizable substance of said thermoplastic resin A is included per 100 parts by weight of said thermoplastic resin A; and wherein said fourth polymerizable substance of said thermoplastic resin B is excluded from said thermoplastic resin B.

4. A cross-linking hardenable resin composition in accordance with claim 2 above, wherein 3 to 40 parts by weight of said fourth polymerizable substance of said thermoplastic resin A is included per 100 parts by weight of said thermoplastic resin A; and wherein said fourth polymerizable substance of said thermoplastic resin B is excluded from said thermoplastic resin B.

5. A cross-linking hardenable resin composition in accordance with claim 1 above, wherein said fourth polymerizable substance of said thermoplastic resin A is excluded from said thermoplastic resin A; and wherein 3 to 45 parts by weight of said fourth polymerizable substance of said thermoplastic resin B is included per 100 parts by weight of said thermoplastic resin B.

6. A cross-linking hardenable resin composition in accordance with claim 2 above, wherein said fourth polymerizable substance of said thermoplastic resin A is excluded from said thermoplastic resin A; and wherein 3 to 40 parts by weight of said fourth polymerizable substance of said thermoplastic resin B is included per 100 parts by weight of said thermoplastic resin B.

7. A cross-linking hardenable resin composition in accordance with any of claims 1 through 6 above, wherein 51 to 100 weight of said cross-linking monomer is comprised by at least one compound encompassed by general chemical structure diagram III below:

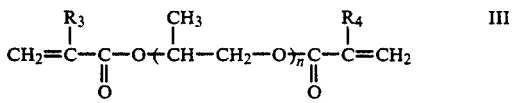

where $R_3$ and $R_4$ each represent a hydrogen atom or methyl group, and n is an integral value between 5 and 9, inclusive.

8. A cross-linking hardenable resin composition in accordance with any of claims 1 through 6 above, wherein 51 to 95 weight % of said cross-linking monomer is comprised by at least one compound encompassed by general chemical structure diagram III below:

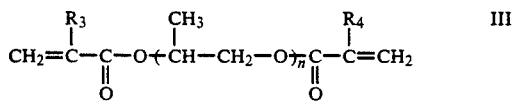

where $R_3$ and $R_4$ each represent a hydrogen atom or methyl group, and n is an integral value between 5 and 9, inclusive, and wherein 5 to 49 weight % of said cross-linking monomer is comprised by at least one compound selected from the group of compounds encompassed by general chemical structure diagrams IV and V below:

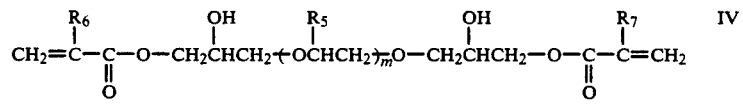

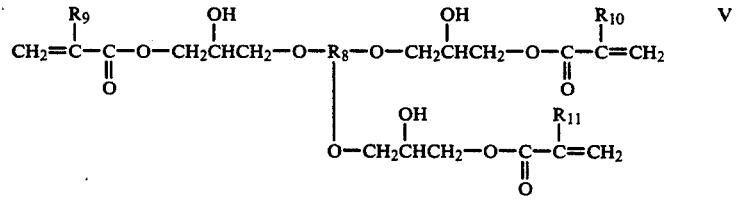

where $R_5$, $R_6$ and $R_7$ in structural diagram IV and $R_9$, $R_{10}$ and $R_{11}$ in structural diagram V each represent a hydrogen atom or methyl group, $R_8$ in structural diagram V represents a 3 to 15 carbon atom organic residue, and m in structural diagram IV is an integral value between 1 and 11, inclusive.

* * * * *